(12) United States Patent
Mizumura

(10) Patent No.: US 12,456,599 B2
(45) Date of Patent: Oct. 28, 2025

(54) METAL PATTERN INSPECTION METHOD AND FOCUSED ION BEAM APPARATUS

(71) Applicant: V TECHNOLOGY CO., LTD., Yokohama (JP)

(72) Inventor: Michinobu Mizumura, Yokohama (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 397 days.

(21) Appl. No.: 18/027,051

(22) PCT Filed: Aug. 4, 2021

(86) PCT No.: PCT/JP2021/028999
§ 371 (c)(1),
(2) Date: Mar. 17, 2023

(87) PCT Pub. No.: WO2022/064871
PCT Pub. Date: Mar. 31, 2022

(65) Prior Publication Data
US 2023/0326714 A1    Oct. 12, 2023

(30) Foreign Application Priority Data

Sep. 25, 2020    (JP) .................. 2020-160965

(51) Int. Cl.
*H01J 37/28*    (2006.01)
*H01J 37/22*    (2006.01)
(Continued)

(52) U.S. Cl.
CPC ............ *H01J 37/28* (2013.01); *H01J 37/226* (2013.01); *H01J 37/244* (2013.01);
(Continued)

(58) Field of Classification Search
CPC .. H01J 37/00; H01J 37/02; H01J 37/26; H01J 37/28; H01J 37/226; H01J 37/244;
(Continued)

(56) References Cited

U.S. PATENT DOCUMENTS

| 5,376,883 A | 12/1994 | Kaito |
| 2007/0187621 A1* | 8/2007 | Ward ...................... H01J 37/20 250/492.21 |

(Continued)

FOREIGN PATENT DOCUMENTS

| JP | 04-313249 A | 11/1992 |
| JP | 05-160212 A | 6/1993 |

(Continued)

OTHER PUBLICATIONS

Notice of Review Opinion, dated Dec. 2, 2024, issued for the corresponding Taiwanese Patent Application No. 110129881, 7 pages, with English translation.

(Continued)

*Primary Examiner* — Jason L McCormack
(74) *Attorney, Agent, or Firm* — LUCAS & MERCANTI, LLP

(57) ABSTRACT

A metal pattern inspection method which applies a pulsed voltage to a metallic pattern, sets a cycle of the pulsed voltage to be shorter than a scanning cycle in which a focused ion beam is swept, indicating only a region of a secondary charged particle image corresponding to a portion of the metallic pattern which is isolated by a wire breakage and to which the pulsed voltage is applied in the form of a first pattern created as a function of surface electrical potentials changing in level with time, detecting, as a disconnection, a boundary between the first pattern and a second pattern created as a function of surface electrical potentials not changing in level with time, and determining whether (Continued)

there is a breaking of or a short circuit in the metallic pattern based on the presence or absence of the disconnection.

11 Claims, 10 Drawing Sheets

(51) Int. Cl.
  *H01J 37/244* (2006.01)
  *H01J 37/317* (2006.01)
  *H01J 37/32* (2006.01)
(52) U.S. Cl.
  CPC .... *H01J 37/3178* (2013.01); *H01J 37/32449* (2013.01); *H01J 2237/2806* (2013.01); *H01J 2237/2817* (2013.01)
(58) Field of Classification Search
  CPC .. H01J 37/3178; H01J 37/32449; H01J 37/20; H01J 37/317; H01J 2237/2806; H01J 2237/2817; H01J 2237/2008; H01J 2237/2594; H01J 2237/2809; H01J 2237/3174; H01J 2237/31749; G01R 31/52; G01R 31/54; G01R 31/265; G01R 31/2812; G01R 31/302; G01R 31/306; G01R 31/2653; G01N 23/2255; H01L 22/00; H01L 22/12
  USPC .................................. 250/306, 307, 310, 311
  See application file for complete search history.

(56) References Cited

U.S. PATENT DOCUMENTS

| | | | |
|---|---|---|---|
| 2015/0213997 | A1 | 7/2015 | Ward et al. |
| 2019/0378682 | A1 | 12/2019 | Wang et al. |
| 2020/0006033 | A1* | 1/2020 | Hung .................. H01J 37/26 |

FOREIGN PATENT DOCUMENTS

| | | |
|---|---|---|
| JP | 06-244177 A | 9/1994 |
| JP | 10-144742 A | 5/1998 |
| JP | 10-294344 A | 11/1998 |
| JP | 2001-077163 A | 3/2001 |
| JP | 2009-130026 A | 6/2009 |
| TW | 202001972 A | 1/2020 |

OTHER PUBLICATIONS

International Search Report (PCT/ISA/210) for International Application No. PCT/JP2021/028999, mailed Oct. 26, 2021. (5 pages).
Written Opinion (PCT/ISA/237) for International Application No. PCT/JP2021/028999, mailed Oct. 26, 2021. (4 pages).
Notice of Reasons for Refusal, mailed on Aug. 20, 2024 for the corresponding Japanese Patent Application No. 2020-160965, 8 pages, with English Translation.

* cited by examiner

METAL PATTERN INSPECTION METHOD AND FOCUSED ION BEAM APPARATUS

CROSS-REFERENCE TO RELATED APPLICATION

This application is a 35 U.S.C. 371 National Phase Entry Application of International Patent Application PCT/JP2021/028999 filed Aug. 4, 2021, which claims priority to Japanese Patent Application No. 2020-160965 filed Sep. 25, 2020, the disclosures of which are incorporated herein in their entirety by reference, and priority is claimed to each of the foregoing.

FIELD OF THE INVENTION

The present invention relates generally to a metal pattern inspection method and a focused ion beam apparatus.

BACKGROUND

A method is known which uses a focused ion beam device to apply an AC signal to a conductive wire on a substrate and also scans a surface of the substrate with a focused ion beam to detect secondary charged particles for use in producing a distribution of electrical potentials on the surface in the form of an image (see Patent Literature 1). Such a method enables analysis of a cause for a wire breaking or a short circuit using the image.

PRIOR ART DOCUMENT

Patent Literature

Patent Literature 1
 Japanese Patent First Publication No. 1993-160212

SUMMARY OF THE INVENTION

Problem to be Solved by the Invention

However, when the above conventional method is used to inspect a wiring defect, such as a disconnection of wire on a substrate, it will cause an electrical potential on a non-defective region of the surface of the substrate which is other than the disconnection and to which voltage is applied to be identical in level with the applied voltage, which emits the number of secondary electrons as a function of the electrical potential on the non-defective region, while an electrical potential on the surface of the disconnection will be as a function of the state (i.e., resistance) of the disconnection regardless of the applied voltage, which emits the number of secondary electrons different from that in the non-defective region. An image of the substrate is derived whose contrast is as a function of a difference in emitted number of secondary electrons between the non-defective region and the disconnection. Such conventional inspection may, however, result in low level of the contrast between the disconnection and the non-defective region on the image depending upon the state of the disconnection, which will face the risk that it may be difficult to locate the disconnection.

The invention was made in view of the above problem. It is an object of the invention to provide an inspection method for facilitating identification of location of a breaking of or a short circuit in a metallic pattern and also to provide a focused ion beam apparatus.

Means for Solving the Problem

In order to solve the above described problem and achieve the object, there is provided, as one aspect of the invention, an inspection method for a metallic pattern which comprises: (a) applying voltage to a metallic pattern formed on a surface of an inspection target substrate; (b) scanning an inspection region on the inspection target substrate where the metallic pattern is formed using a focused ion beam cyclically in a raster scan mode to produce a secondary charged particle image of the inspection region as a function of intensities of secondary charged particles ejected from the inspection target substrate; and (c) detecting a breaking of or a short circuit in the metallic pattern from the secondary charged particle image. A pulsed voltage which changes in level with time is applied to the metallic pattern. A cycle of the pulsed voltage is selected to be shorter than a scanning cycle in which the focused ion beam is swept in a vertical or a horizontal direction.

In the preferred mode of the invention, a portion of the metallic pattern to which the pulsed voltage is applied is represented on the secondary charged particle image in a form of a first pattern defined as a function of the pulsed voltage changing in level with time, while a portion of the metallic pattern to which the pulsed voltage is not applied is represented on the secondary charged particle image is represented in a form of a second pattern defined as a function of voltage remaining unchanged in level with time. A boundary between the first pattern and the second pattern is detected as a disconnection. The breaking of the metallic pattern is determined to be occurring when the disconnection exists.

In the preferred mode of the invention, a portion of the metallic pattern to which the pulsed voltage is applied is represented on the secondary charged particle image in a form of a first pattern defined as a function of the pulsed voltage changing in level with time, while a portion of the metallic pattern to which the pulsed voltage is not applied is represented on the secondary charged particle image is represented in a form of a second pattern defined as a function of potential remaining unchanged in level with time. Design pattern images which are electrically separate from each other are prepared and compared with the secondary charged particle image to detect the short circuit.

In the preferred mode of the invention, a direction in which the focused ion beam is swept is selected to be perpendicular to a direction in which the metallic pattern extends.

According to another aspect of the invention, there is provided a focused ion beam apparatus which comprises: (a) a focused ion beam optical system which works to emit a focused ion beam to an inspection target substrate which has a metallic pattern formed on a surface thereof; (b) a secondary charged particle detector which works to measure intensities of secondary charged particles ejected from the inspection target substrate when subjected to the focused ion beam; (c) an image generator which produces an image of the inspection target substrate in a form of a secondary charged particle image as a function of the intensities measured by the secondary charged particle detector; and (d) a mechanism which works to apply voltage to the inspection target substrate. The focused ion beam optical system serves to cyclically scan an inspection region which has the metallic pattern formed on the inspection target substrate using a focused ion beam in a raster scan mode. A pulsed voltage which changes in level with time is applied to the metallic pattern. A cycle of the pulsed voltage is selected to be shorter than a scanning cycle in which the focused ion beam is swept in a vertical direction. The image generator produces a first pattern and a second pattern. The first pattern is defined as a function of the pulsed voltage changing in level with time and appears on a portion of the metallic pattern to which the pulsed voltage is applied on the secondary charged particle image. The second pattern is defined as a function of potential not changing in level with time and appears on a portion of the metallic pattern to which the pulsed voltage is not applied.

In the preferred mode of the above focused ion beam apparatus, a direction in which the focused ion beam is swept is selected to be perpendicular to a direction in which the metallic pattern extends.

In the preferred mode, the above focused ion beam apparatus further comprises a film formation controller which delivers deposition gas to a breaking of the metallic pattern which is detected by analyzing the secondary charged particle image produced by the image generator. The focused ion beam optical system emits the focused ion beam to decompose the deposition gas to form a repairing CVD film on the breaking.

In the preferred mode, the focused ion beam optical system works to emit the focused ion beam to the short circuit in the metallic pattern which is detected by analyzing the secondary charged particle image produced by the image generator to remove the short circuit using sputtering techniques.

In the preferred mode, the mechanism serving to apply the voltage to the inspection target substrate includes a probing mechanism which applies the pulsed voltage to the metallic pattern.

Beneficial Advantages Offered by the Invention

The present invention realizes a metallic pattern inspection method and a focused ion beam apparatus which are capable of facilitating identification of an undesirable breaking of a metallic pattern and also detecting a short circuit in the metallic pattern.

BRIEF DESCRIPTION OF THE DRAWINGS

FIG. 3-1 is an explanatory plane view which illustrates which illustrates an inspection region and scanning directions in which a focused ion beam is swept in an inspection method for a metallic pattern according to the first embodiment of the invention.

FIG. 3-2 is a view which demonstrates a raster scan voltage (X) used for a scanning sweep in an X-direction and a cycle Tx thereof in an inspection method for a metallic pattern according to the first embodiment of the invention.

FIG. 3-3 is a view which demonstrates a raster scan voltage (Y) used for a scanning sweep in a Y-direction and a cycle Ty thereof in an inspection method for a metallic pattern according to the first embodiment of the invention.

FIG. 3-4 is a view which demonstrates a probing voltage (Vp) and a cycle TVp thereof in an inspection method for a metallic pattern according to the first embodiment of the invention.

FIG. 4-1 is a view which illustrates a secondary charged particle image derived in an inspection method for a metallic pattern according to the first embodiment of the invention.

FIG. 4-2 is a view which illustrates a comparative example of a secondary charged particle image.

FIG. 4-3 is an explanatory view which illustrates design patterns which are arranged adjacent each other and electrically separate from each other.

FIG. 4-4 is an explanatory view which illustrates the layout of conductors corresponding to design patterns electrically separate from each other.

MODE FOR CARRYING OUT THE INVENTION

A metal pattern inspection method according to the present invention may be used in detecting a disconnection (i.e., breaking) of or a short circuit in a conductor(s) of a semiconductor device or an FPD (Flat Panel Display) or in a metallic pattern, such as a mask pattern of a photomask. A focused ion beam apparatus according to the present invention may be used in detecting secondary charged particles to produce a secondary charged particle image for detecting a disconnection of a conductor and is equipped with a probing mechanism working to remove an insulating film from a metallic pattern, form a film using CVD techniques, or apply voltage to a metallic pattern.

The inspection method for checking a disconnection (i.e., a breaking) of or a short circuit in a metallic pattern and the focused ion beam apparatus according to an embodiment of the invention will be described below in detail with reference to the drawings. It should be noted that the drawings are schematic, so that the dimension, ratio, number, and shape of each element differ from those of the real element. In addition, there are parts or portions in which the dimensional relationship, ratio, and shape are different among the drawings.

First Embodiment (Structure of Focused Ion Beam Apparatus)

Prior to explanation of the metallic pattern inspection method, the focused ion beam apparatus designed to execute such a method will be described below.

Figure 1:
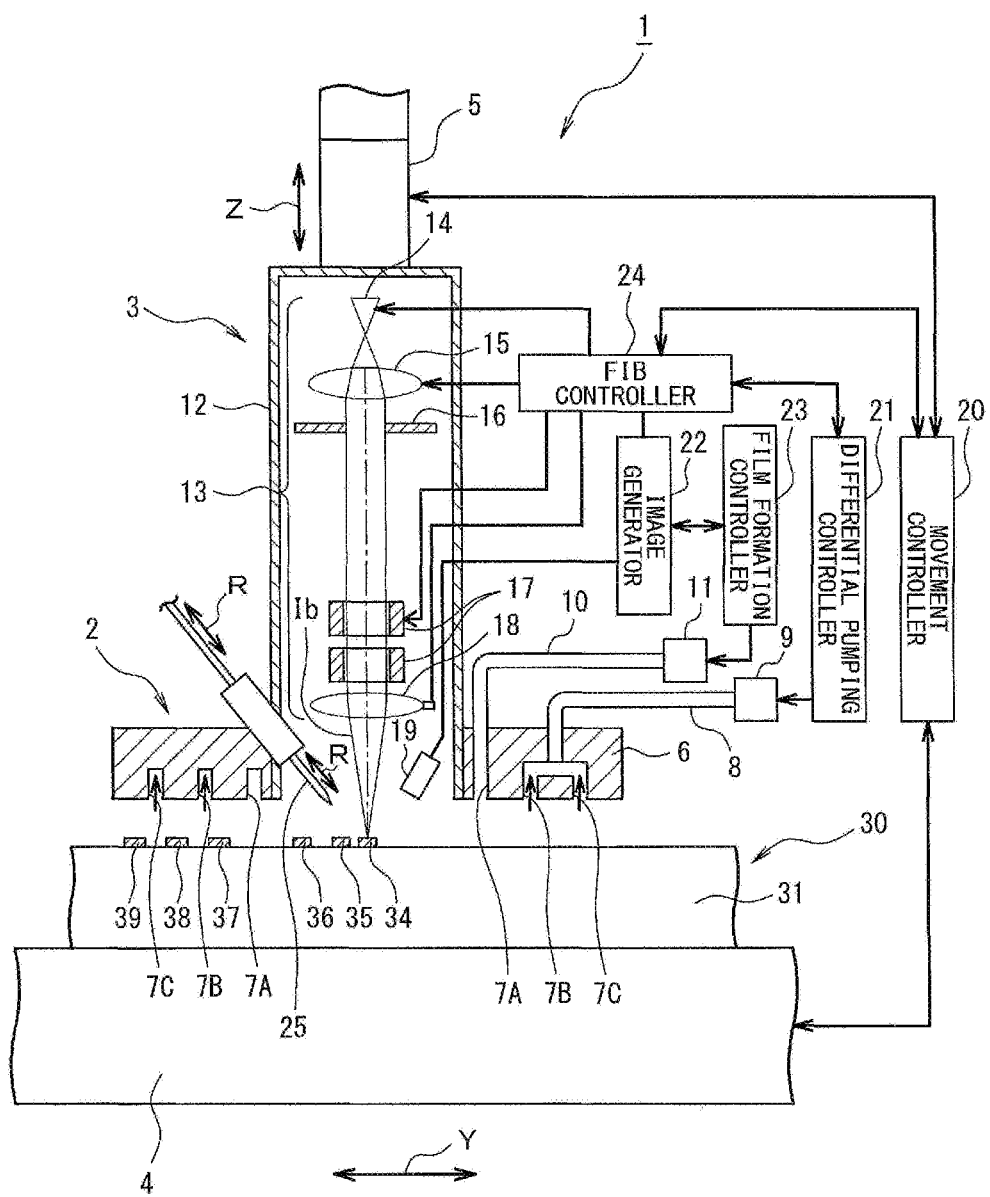
FIG. 1 is a sectional view which schematically illustrates highlights of a structure of a focused ion beam apparatus according to the first embodiment of the invention.

FIG. 1 schematically illustrates a structure of the focused ion beam apparatus 1 according to the first embodiment. The focused ion beam apparatus 1 includes the differential pumping device 2, the focused ion beam column (which will also be referred to as an FIB column) 3, the substrate support stage 4 on which the inspection target substrate is mounted, the elevating mechanism 5, the movement controller 20, the differential pumping controller 21, the image generator 22, the film formation controller 23, and the FIB controller 24.

Figure 2:
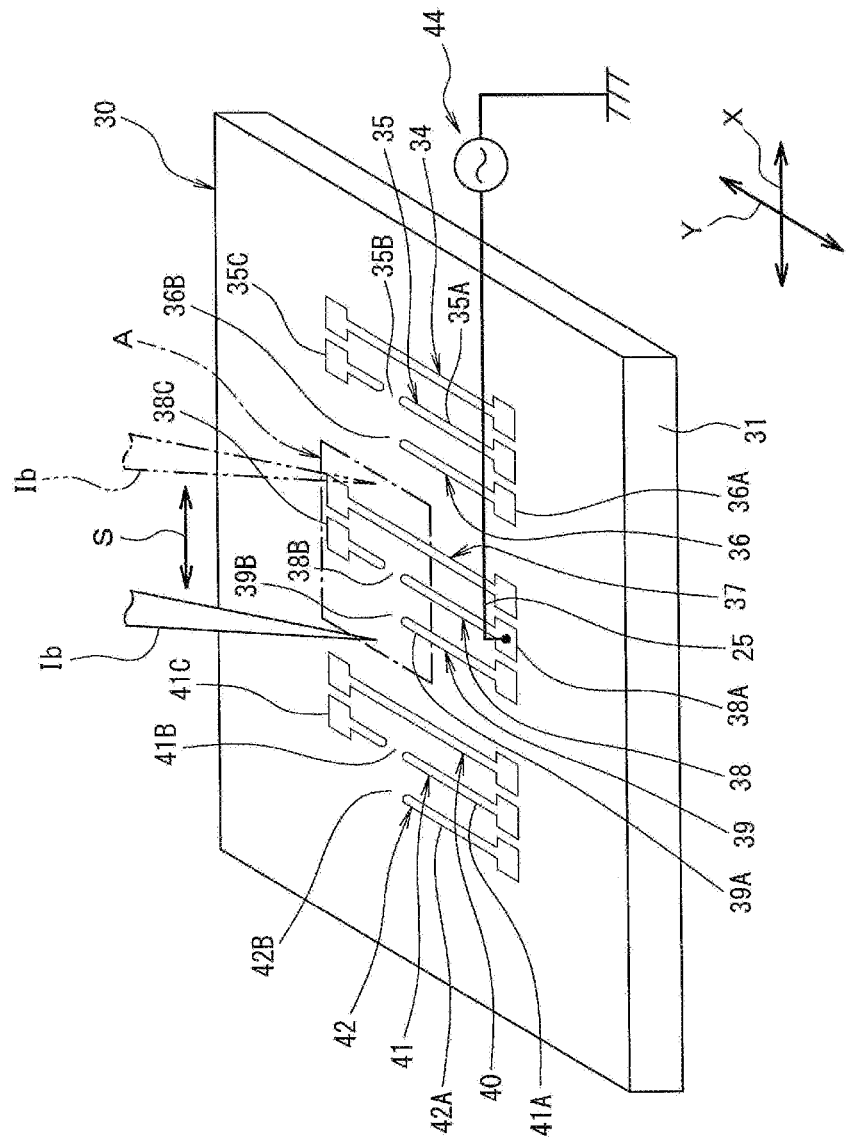
FIG. 2 is a perspective view which illustrates an inspection method for a metallic pattern according to the first embodiment of the invention.

The inspection target substrate 30 to be inspected in this embodiment, as can be seen in FIG. 2, includes the $SiO_2$-made insulating substrate 31 and a plurality of conductors 34 to 42 extending parallel to each other on the surface of the insulating substrate 31. The conductors 34 to 42 are in the shape of metallic patterns to be inspected or checked by the focused ion beam apparatus 1 for disconnection or short circuits.

The inspection target substrate 30 is illustrated in FIG. 2 as a sample for the sake of convenience of disclosure. The conductor 35 has a broken portion (which will also be referred to as a breaking or disconnection) 35B and thus includes two portions: the portions 35A and 35C. Similarly, the conductor 38 has the disconnection 38B and thus include the portions 38A and 38C. The conductor 41 has the disconnection 41B and thus includes the portions 41A and 41C. The conductor 36 has the disconnection 36B. Similarly, the conductors 39 and 42 have the disconnections 39B and 42B, respectively. Of course, the inspection target substrate 30 whose disconnection(s) is not yet found is used in an inspection operation in this embodiment.

The substrate support stage 4 bears the inspection target substrate 30 thereon. The substrate support stage 4 is moved in X- and Y-directions using an actuator controlled by the movement controller 20.

The differential pumping device 2 is, as illustrated in FIG. 1, equipped with the head 6. The head 6 is made of a disc-shaped metallic plate which is much smaller in area than the inspection target substrate 30. The head 6 is moved by movement of the substrate support stage 4 in X- and Y-directions so that it faces a selected region of the inspection target substrate 30. The differential pumping device 2 is controlled in operation by the differential pumping controller 21.

The head 6 has three annular grooves 7A, 7B, and 7C formed concentrically in a lower surface thereof. The annular groove 7A that is an innermost one of the annular grooves 7A to 7C in the head 6 is connected to the deposition gas delivery mechanism 11 through the deposition gas supply pipe 10. The deposition gas delivery mechanism 11 is controlled in operation by the film formation controller 23.

The vacuum pump 9 is connected to the annular grooves 7B and 7C through the outlet pipe 8. The vacuum pump 9 is controlled in operation by the differential pumping controller 21. The head 6 is oriented to have the lower surface facing the inspection target substrate 30 and functions to create a high-level vacuum beneath the center of the head 6 with the aid of air suction from the annular grooves 7B and 7C. In this condition, the annular groove 7A is capable of delivering the deposition gas to form CVD films which repair, for example, the disconnections 35B, 36B, 38B, 39B, 41B, and 42B illustrated in FIG. 2.

The FIB column 3 is, as clearly illustrated in FIG. 1, disposed on an upper surface of the head 6 and joined to the head 6 with a top end thereof embedded in a central orifice of the head 6. The elevating mechanism 5 is arranged on the upper end of the FIB column 3 and works to move the differential pumping device 2 upward or downward. The elevating mechanism 5 is retained by a support flame, not shown. The elevating mechanism 5 functions to move the FIB column 3 and the differential pumping device 2 upward or downward. The elevating mechanism 5 is controlled in operation by the movement controller 20.

The FIB column 3 includes the cylindrical chamber 12 and the focused ion beam optical system 13 installed inside the cylindrical chamber 12. The FIB column 3 is configured to emit the ion beam Ib from the head thereof toward the surface of the inspection target substrate 30. The focused ion beam optical system 13 includes the ion source 14, the condenser lens 15, the deflector 17, and the objective lens 18. The deflector 17 is controlled in operation by the FIB controller 24 and works to cyclically sweep a spot of the focused ion beam Ib in a given scanning direction S (see FIG. 2) over the whole of the inspection region A, as demonstrated in FIG. 2, in a raster scanning mode.

The secondary charged particle detector 19 which is made of, for example, a scintillator is arranged on a lower portion of the cylindrical chamber 12. The secondary charged particle detector 19 works to measure intensities of secondary charged particles ejected or sputtered from the inspection target substrate 30 when subjected to the focused ion beam Ib. The secondary charged particle detector 19 connects with the image generator 22. The image generator 22 is capable of producing and displaying a distribution of potentials on the surface of the inspection target substrate 30 in the form of a secondary charged particle image as a function of outputs (i.e., the intensities) from the secondary charged particle detector 19.

The cylindrical chamber 12, as illustrated in FIG. 1, has installed in the lower portion thereof a probing mechanism equipped with the voltage applying probe 25 which is movable toward or away from the inspection target substrate 30 in an advancing/retracting direction, as indicated by arrow R in FIG. 1, and serves to apply voltage to the inspection target substrate 30. In this embodiment, the voltage applying probe 25 is connected to the pulsed power supply 44 and electrically connectable with the conductors 34 to 42 on the inspection target substrate 30 in direct contact therewith. The voltage applying probe 25 is used to apply voltage to the conductors 34 to 42.

In this embodiment, a cycle of application of a pulsed voltage (which is also called a pulse voltage or a probing voltage) is determined to be shorter than a scanning cycle in a vertical direction (i.e., y-direction) in the above described raster scan mode. Accordingly, in this embodiment, the pulsed voltage is applied only to, for example, the portion 38A of the conductor 38 at which the disconnection 38B is occurring on the secondary charged particle image, as demonstrated in FIGS. 2 and 4-1. This causes the electrical potential only on the surface of the portion 38A to change with time, so that it appears in the shape of a striped pattern (which will also be referred to as a first pattern) as a function of the pulsed voltage. In other words, the portion 38C not subjected to the pulsed voltage outputted from the voltage applying probe 25 undergoes no change in electrical potential on the surface thereof, so that it appears in the shape of a monotone pattern (which will also be referred to as a second pattern) as a function of voltage remaining unchanged in level with time. Such a pattern difference arising from the disconnection also appears on each of the other conductors at which the disconnections are occurring.

How to Inspect Metallic Pattern and Inspection Operation

Figure 5:
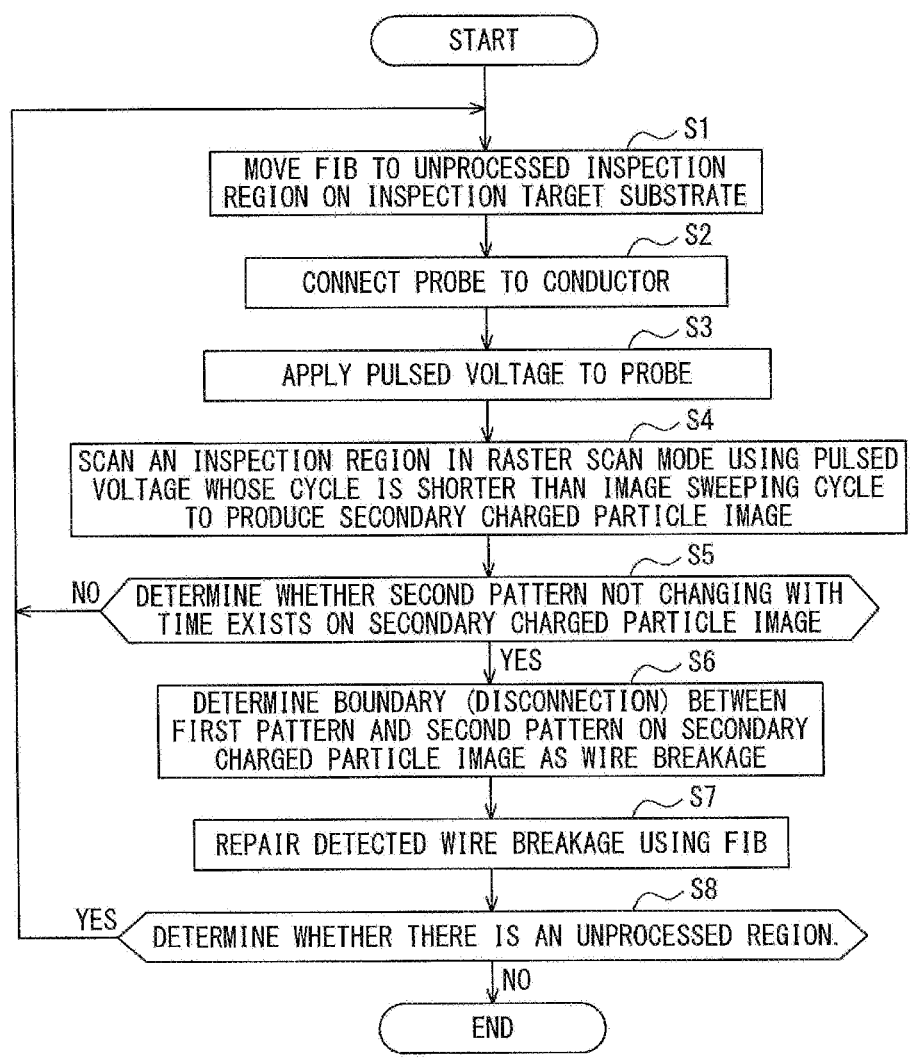
FIG. 5 is a flowchart which illustrates a control method for detecting a breakage of wire and repair such a wire breakage achieved in a focused ion beam apparatus according to the first embodiment of the invention.

The inspection method for metallic patterns on the inspection target substrate 30 using the focused ion beam apparatus 1 and operation of the focused ion beam apparatus 1 in the first embodiment will be described below. The focused ion beam apparatus 1 in this embodiment executes tasks according to the flowchart illustrated in FIG. 5.

First, the inspection target substrate 30 is placed fixedly on the substrate support stage 4 of the focused ion beam apparatus 1. The substrate support stage 4 is then actuated using a control signal outputted from the movement controller 20 to move the FIB column 3 to a location, as illustrated in FIG. 2, where the FIB column 3 is enabled to emit the focused ion beam Ib to the inspection region A which is not yet processed (see step S1).

The voltage applying probe 25 is, as illustrated in FIG. 1, extended in the advancing/retracting direction R (indicated by the arrow) to achieve connection with a selected one of the conductors 34 to 42 (see step S2).

The pulsed voltage is applied to the voltage applying probe 25 (see step S3). The pulsed voltage may alternatively be applied to the voltage applying probe 25 in step S2.

The spot of the focused ion beam Ib is swept within the inspection region A in the raster scan mode. In such a scan, the cycle of the pulsed voltage is selected to be shorter than a scanning cycle (i.e., an image sweeping cycle) in the vertical direction (i.e., the y-direction). Using an output of the secondary charged particle detector 19 derived in the above raster scan mode, the secondary charged particle image is created in the image generator 22 (see step S4).

A region of the selected one of the conductors 34 to 42 (e.g., the conductor 38 in FIG. 2) where the first pattern which is temporally changing is appearing on the secondary charged particle image and a region on the secondary charged particle image where the second pattern which remains unchanged with time is appearing are determined (see step S5). If the second pattern (i.e., the monotone pattern) does not appear on the secondary charged particle image, the routine returns back to Step S1.

It there is an area on the secondary charged particle image where the second pattern which remains unchanged with time is appearing, an area between the first pattern and the second pattern is determined as a region where a breaking of wire, i.e., a disconnection of a conductor is occurring (see step S6).

The disconnection derived in the above manner is repaired using the focused ion beam optical system 13 (see step S7). Specifically, the film formation controller 23 controls the operation of the deposition gas delivery mechanism 11 to supply deposition gas to the annular groove 7A and emits the focused ion beam Ib to decompose or degrade the deposition gas to form a film using CVD techniques.

In step S8, it is determined whether there is the inspection region A that is an area on the inspection target substrate 30 which is not yet processed.

If it is determined that there is not the inspection region A on the inspection target substrate 30, then the routine terminates. Alternatively, if it is determined that there is the inspection region A which is not yet processed, the routine returns back to step S1.

Condition for Producing First Pattern

Figures 1, 3:
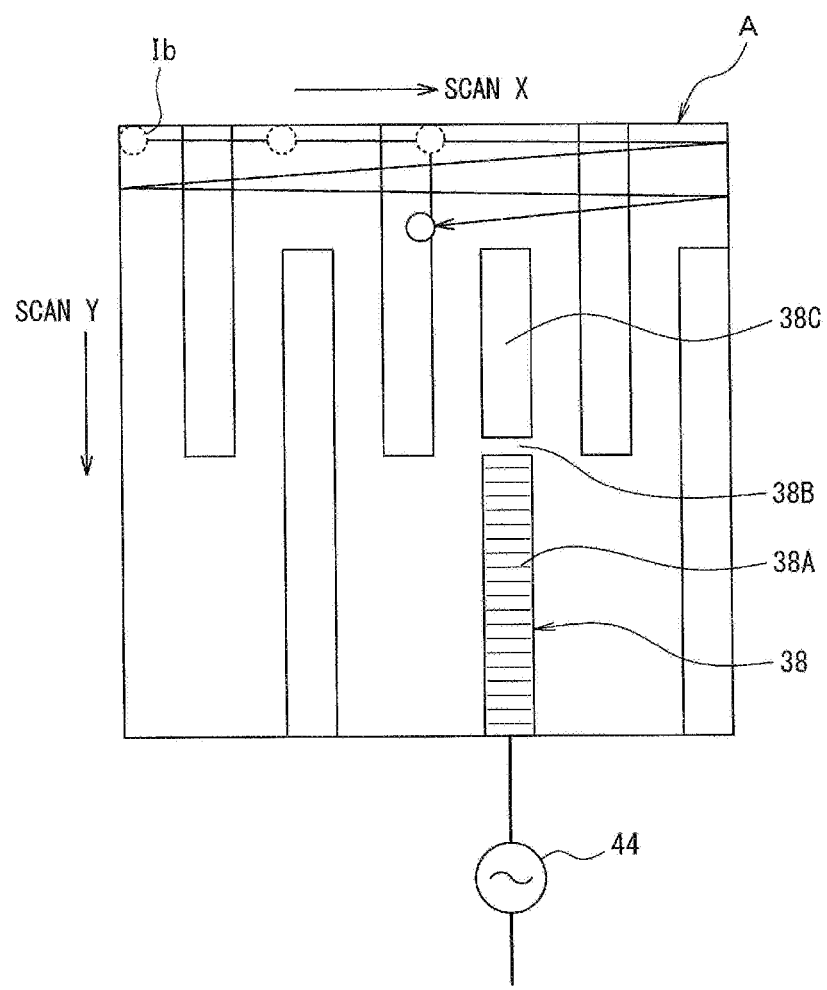
Figures 2, 3:
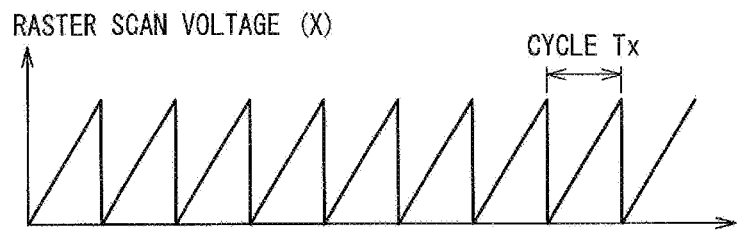
Figure 3:
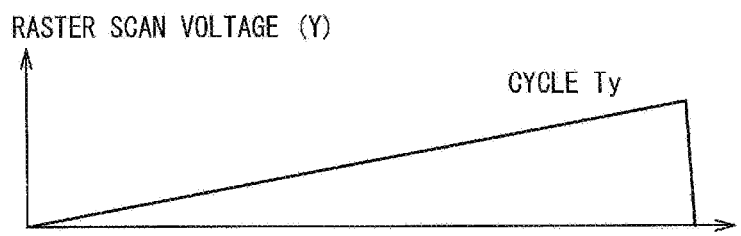
Figures 3, 4:
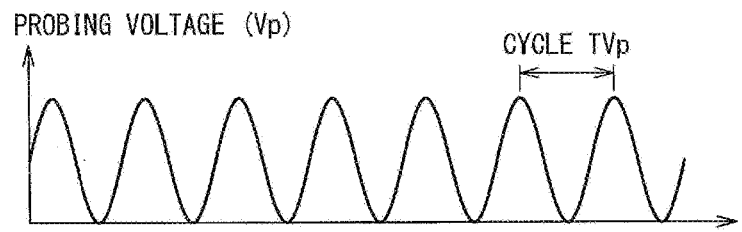
Figures 1, 4:
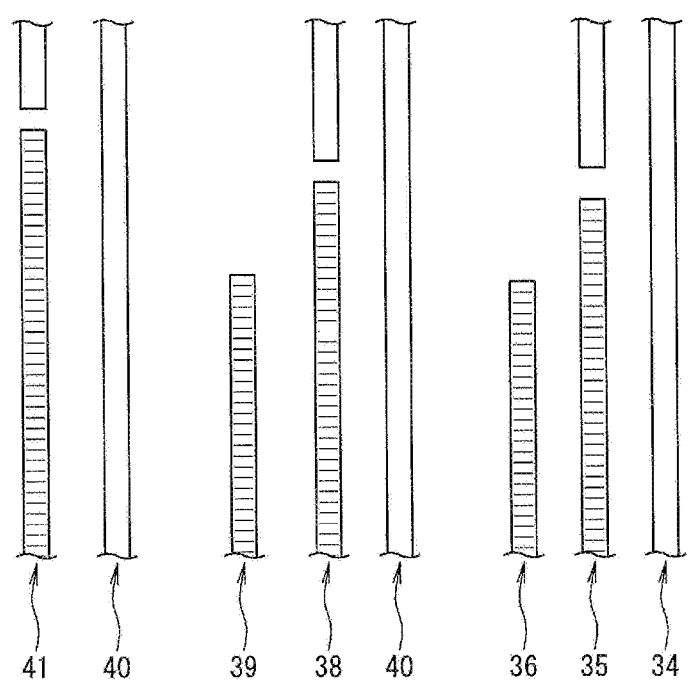
Figures 2, 4:
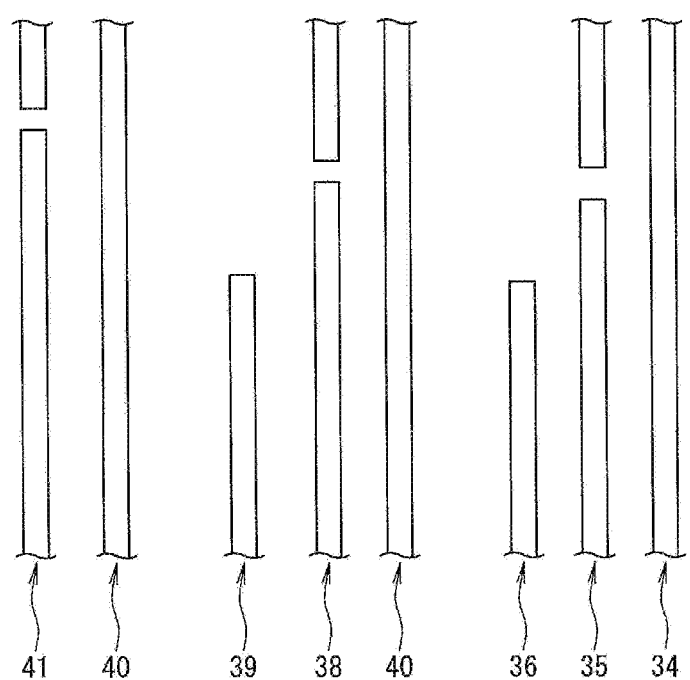
Figures 3, 4:
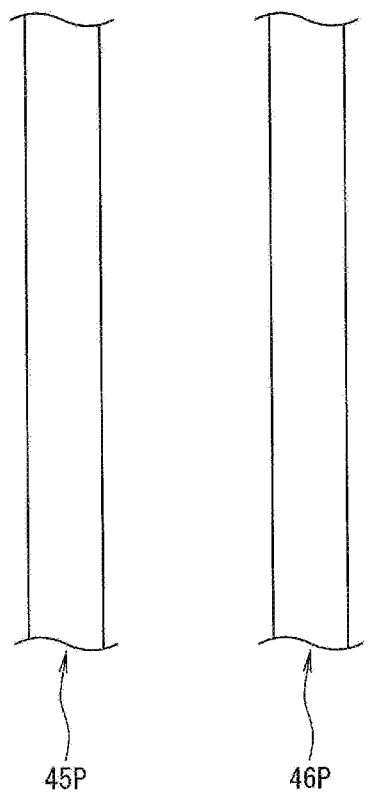
Figure 4:
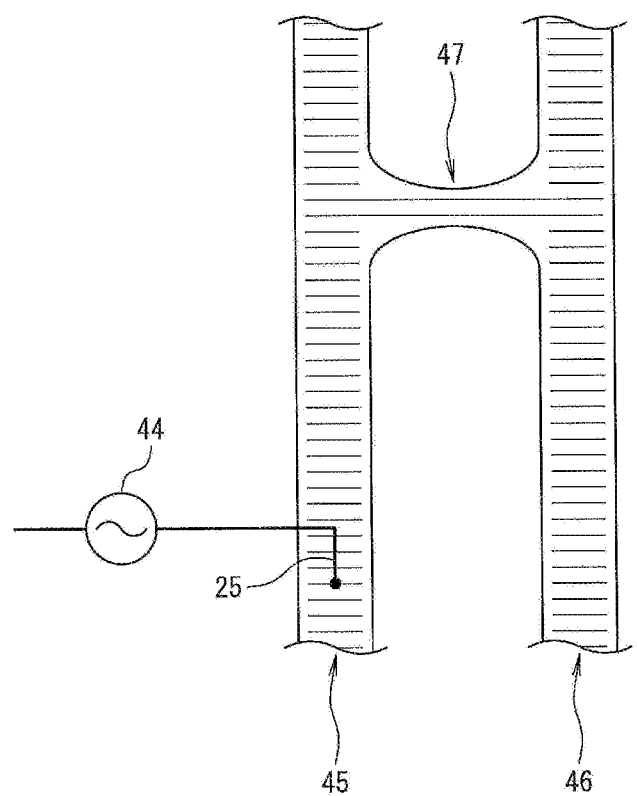

In this embodiment, the inspection region A is, as demonstrated in FIG. 3-1, scanned with the focused ion beam Ib swept cyclically in the X-direction (as indicated by "scan X" in the drawing) in the raster scan mode. FIG. 3-2 illustrates the raster scan voltage (X) used in a horizontal sweep in the X-direction (i.e., the horizontal direction) in the raster scan mode and the cycle Tx in which the raster scan voltage (X) changes in level. FIG. 3-3 illustrates the raster scan voltage (Y) used in a vertical sweep in the Y-direction (i.e., the vertical direction) in the raster scan mode and the cycle Ty of the raster scan voltage (Y). FIG. 3-4 illustrates the probing voltage (Vp) applied to the voltage applying probe 25 and the cycle TVp of the probing voltage (Vp). Taking the conductor 38 as an example, a direction in which the conductor 38 extends is set to coincide with the Y-direction perpendicular to the direction as denoted by "scan X". The direction in which, for example, the conductor 38 extends may alternatively be selected to coincide with another direction other than the Y-direction. In this embodiment, the above cycles are selected to meet a relation of Tx<TVp<Ty.

The cycle TVp of the probing voltage is, as described above, selected to be shorter than the scanning cycle (Ty) in the Y-direction in the raster scan mode, thereby causing the probing voltage to cyclically change between a low level (L) and a high level (H) in each of the scan lines along which the focused ion beam Ib is, as demonstrated in FIG. 3-1, swept in the X-direction and which are arranged adjacent each other in the Y-direction. This causes the pulsed voltage to be applied only to the portion 38A which is separate from the disconnection 38B and connects with the voltage applying probe 25, so that the portion 38A appears as the first pattern in the form of a striped pattern made up of light and dark bands arranged alternately adjacent each other on the secondary charged particle image. In other words, the portion 38C to which no pulsed voltage is applied by the voltage applying probe experiences no change in electrical potential on the surface thereof, so that it appears, as can be seen in FIGS. 3-1 and 4-1, in the form of a monotone pattern.

How to Inspect Metallic Pattern and Beneficial Advantages Offered by Focused Ion Beam Apparatus In this embodiment, areas on the conductors 34 to 41 to which the probing voltage (i.e., pulsed voltage) has been applied, as illustrated in FIG. 4-1, each appear in the form of the first striped pattern on the secondary charged particle image, while areas on the conductors 34 to 41 which are not subjected to application of the probing voltage (i.e., pulsed voltage) each appear in the form of the second non-striped pattern on the secondary charged particle image, thereby facilitating ease of identification of one(s) of the conductors 34 to 41 where the disconnection is appearing. In contrast, a secondary charged particle image, as demonstrated in a comparative example in FIG. 4-2, derived without application of voltage to a metallic pattern has conductors all of which are represented in the form of a monotone pattern, thus needing to inspect each of all the conductors, which requires an increased time to find or locate the disconnection(s).

In this embodiment, the focused ion beam apparatus 1 may be used to compare a design pattern image with the secondary charged particle image representing the actual first pattern to identify or locate the disconnection(s) of the conductors 34 to 41. Specifically, design pattern images which are, as illustrated in FIG. 4-3, electrically discrete from each other are prepared in advance. FIG. 4-3 shows portions of the design pattern images and illustrates, as an example, the design pattern 45P and the design pattern 46P which are electrically independent from each other. FIG. 4-4 demonstrates the conductor (i.e., metallic pattern) 45 and the conductor (i.e., metallic pattern) 46 actually arranged on the inspection target substrate 30 corresponding to the design patterns 45P and 46P in FIG. 4-3. In the case, as illustrated in FIG. 4-4, where the voltage applying probe 25 is placed in connection with only the conductor 45, but the conductor 46, like the conductor 45, also appears in the form of the striped first pattern, the short circuit 47 may be found or located by analyzing differences of the images of the conductors 45 and 46 from the design pattern images in FIG. 4-3.

As apparent from the above discussion, this embodiment is capable of locating a short circuit when an area on the secondary charged particle image which exhibits the striped first pattern is determined as occupying conductors (i.e., metallic patterns) which are arranged adjacent each other and electrically discrete from each other. Such localization of the short circuit is, as described above, achieved easily by comparing the area exhibiting the first pattern with the electrically separate design pattern images. This eliminates the need for measuring a resistance between conductors which should be electrically separate from each other to detect a short circuit therebetween.

Second Embodiment

Figure 6:
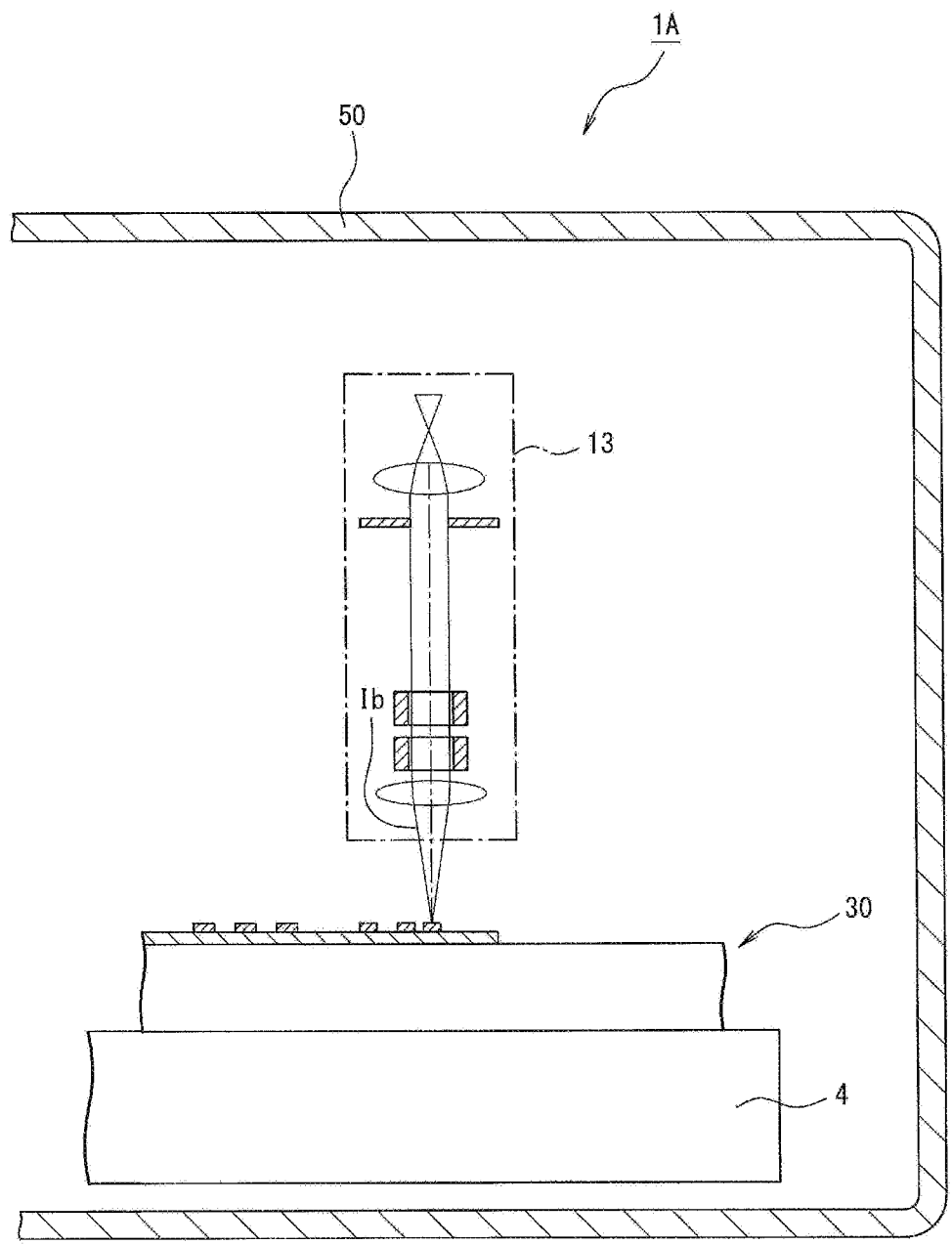
FIG. 6 is a sectional view which schematically shows highlights of a structure of a focused ion beam apparatus according to the second embodiment of the invention.

FIG. 6 is a sectional view which illustrates highlights of the focused ion beam apparatus 1A according to the second embodiment of the invention. The focused ion beam apparatus 1A includes the focused ion beam optical system 13 and a sample stage disposed in a chamber. Other arrangements are identical with those in the focused ion beam apparatus 1 in the first embodiment.

Other Embodiments

Although the embodiments of the present invention have been described, the description and drawings, which is a part of the disclosure of these embodiments, should not be understood to limit the present invention. From this disclosure, alternative embodiments, examples, and operational technology should be clear to a person skilled in the art.

The secondary charged particle detector 19 may alternatively be made to have a structure other than a scintillator.

The direction in which the spot of the focused ion beam Ib is swept in the raster scan mode is selected in the above embodiments to coincide with the lengthwise direction of the conductors 34 to 42, but however, they may alternatively be oriented to cross each other as long as the spot of the focused ion beam Ib is shaped to have a diameter smaller than a width of each of the conductors 34 to 41. This enables a selected one of the conductors 34 to 42 with which the voltage applying probe 25 is placed in contact to appear in the form of vertical stripes on the secondary charged particle image.

The above embodiments use the probing voltage in the form of a pulsed voltage, but however, may alternatively use a temporally changing voltage, such as a sawtooth voltage or a sinewave voltage.

The invention may be employed to emit the focused ion beam Ib to a short circuit between metallic patterns which is detected by analyzing a secondary charged particle image and remove the short circuit using sputtering techniques.

EXPLANATION OF REFERENCE SYMBOLS

A Inspection region
B Light band
D Dark band
Ib Focused ion beam
R Advancing/retracting direction
S Scanning direction
1 Focused ion bean apparatus
2 Differential pumping device
3 Focused ion beam column (FIB column)
4 Substrate support stage
5 Elevating mechanism
6 Head
7A Annular groove (innermost groove)
7B, 7C Annular groove
8 Outlet pipe
9 Vacuum pump
10 Deposition gas supply pipe
11 Deposition gas delivery mechanism
12 Chamber
13 Focused ion beam optical system
14 Ion source
15 Condenser lens
16 Orifice
17 Deflector
18 Objective lens
19 Secondary charged particle detector
20 Movement controller
21 Differential pumping controller
22 Image generator
23 Film formation controller
24 FIB controller
25 Voltage applying probe
30 Inspection target substrate
31 Insulating substrate
34-42, 45, 46 Conductor (Metallic pattern)
35B, 36B, 38B, 39B, 41B, 42B Wire breaking (Disconnection)
44 Pulse power source
50 Vacuum chamber

What is claimed is:

1. A metal pattern inspection method comprising:
applying voltage to a metallic pattern formed on a surface of an inspection target substrate;
scanning an inspection region on the inspection target substrate where the metallic pattern is formed using a focused ion beam cyclically in a raster scan mode to produce a secondary charged particle image of the inspection region as a function of intensities of secondary charged particles ejected from the inspection target substrate; and
detecting a breaking of or a short circuit in the metallic pattern from the secondary charged particle image, wherein
a pulsed voltage which changes in level with time is applied to the metallic pattern, and
a cycle of the pulsed voltage is selected to be shorter than a scanning cycle in which the focused ion beam is swept in a vertical or a horizontal direction.

2. The metal pattern inspection method as set forth in claim 1, wherein a portion of the metallic pattern to which the pulsed voltage is applied is represented on the secondary charged particle image in a form of a first pattern defined as a function of the pulsed voltage changing in level with time,
a portion of the metallic pattern to which the pulsed voltage is not applied is represented on the secondary charged particle image is represented in a form of a second pattern defined as a function of voltage remaining unchanged in level with time,
a boundary between the first pattern and the second pattern is detected as a disconnection, and
the breaking of the metallic pattern is determined to be occurring when the disconnection exists.

3. The metal pattern inspection method as set forth in claim 1, wherein a portion of the metallic pattern to which the pulsed voltage is applied is represented on the secondary charged particle image in a form of a first pattern defined as a function of the pulsed voltage changing in level with time,
a portion of the metallic pattern to which the pulsed voltage is not applied is represented on the secondary charged particle image is represented in a form of a second pattern defined as a function of potential remaining unchanged in level with time, and
design pattern images which are electrically separate from each other are prepared and compared with the secondary charged particle image to detect the short circuit.

4. The metal pattern inspection method as set forth in claim 1, wherein a direction in which the focused ion beam is swept is selected to be perpendicular to a direction in which the metallic pattern extends.

5. A focused ion beam apparatus comprising:
a focused ion beam optical system which works to emit a focused ion beam to an inspection target substrate which has a metallic pattern formed on a surface thereof;

a secondary charged particle detector which works to measure intensities of secondary charged particles ejected from the inspection target substrate when subjected to the focused ion beam;

an image generator which produces an image of the inspection target substrate in a form of a secondary charged particle image as a function of the intensities measured by the secondary charged particle detector; and a mechanism which works to apply voltage to the inspection target substrate, wherein the focused ion beam optical system serves to cyclically scan an inspection region which has the metallic pattern formed on the inspection target substrate using a focused ion beam in a raster scan mode, a pulsed voltage which changes in level with time is applied to the metallic pattern, a cycle of the pulsed voltage is selected to be shorter than a scanning cycle in which the focused ion beam is swept in a vertical direction, the image generator produces a first pattern and a second pattern, the first pattern being defined as a function of the pulsed voltage changing in level with time and appearing on a portion of the metallic pattern to which the pulsed voltage is applied on the secondary charged particle image, the second pattern being defined as a function of potential remaining unchanged in level with time and appearing on a portion of the metallic pattern to which the pulsed voltage is not applied.

6. The focused ion beam apparatus as set forth in claim 5, wherein a direction in which the focused ion beam is swept is selected to be perpendicular to a direction in which the metallic pattern extends.

7. The focused ion beam apparatus as set forth in claim 5, further comprising a film formation controller which delivers deposition gas to a breaking of the metallic pattern which is detected by analyzing the secondary charged particle image produced by the image generator, and wherein the focused ion beam optical system emits the focused ion beam to decompose the deposition gas to form a repairing CVD film on the breaking.

8. The focused ion beam apparatus as set forth in claim 5, wherein the focused ion beam optical system works to emit the focused ion beam to circuit in the metallic pattern which is detected by analyzing the secondary charged particle image produced by the image generator to remove the short circuit using sputtering techniques.

9. The focused ion beam apparatus as set forth in claim 5, wherein the mechanism serving to apply the voltage to the inspection target substrate includes a probing mechanism which applies the pulsed voltage to the metallic pattern.

10. The focused ion beam apparatus as set forth in claim 7, wherein the mechanism serving to apply the voltage to the inspection target substrate includes a probing mechanism which applies the pulsed voltage to the metallic pattern.

11. The focused ion beam apparatus as set forth in claim 8, wherein the mechanism serving to apply the voltage to the inspection target substrate includes a probing mechanism which applies the pulsed voltage to the metallic pattern.

* * * * *